(12) United States Patent
Smith et al.

(10) Patent No.: US 6,577,689 B1
(45) Date of Patent: Jun. 10, 2003

(54) TIMING RECOVERY SYSTEM FOR A 10 BASE-T/100 BASE-T ETHERNET PHYSICAL LAYER LINE INTERFACE

(75) Inventors: Eric Smith, Austin, TX (US); Vivek Telang, Austin, TX (US); Stephen Hodapp, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/299,050

(22) Filed: Apr. 23, 1999

Related U.S. Application Data
(60) Provisional application No. 60/082,917, filed on Apr. 24, 1998, provisional application No. 60/082,919, filed on Apr. 24, 1998, and provisional application No. 60/082,918, filed on Apr. 24, 1998.

(51) Int. Cl.[7] .............. H04L 7/00; H04L 25/49; H04L 12/28
(52) U.S. Cl. .............. 375/354; 375/293; 370/395.53; 370/395.62
(58) Field of Search ................. 375/354, 293, 375/344; 370/286, 395.53, 395.62

(56) References Cited

U.S. PATENT DOCUMENTS

| | | | | |
|---|---|---|---|---|
| 4,995,031 A | * | 2/1991 | Aly et al. | 370/32.1 |
| RE34,206 E | * | 3/1993 | Sayar | 375/20 |

* cited by examiner

Primary Examiner—Stephen Chin
Assistant Examiner—Edith Yeh
(74) Attorney, Agent, or Firm—Steven Lin, Esq.

(57) ABSTRACT

A phase lock loop is provided for recovering timing information from a received data signal in a 100Base-TX receiver. The phase lock loop includes a phase encoder (803) for generating a reference phase error. An output phase value on a bus (809) is subtracted from the reference phase value on line (805) with a subtraction block (813) to generate a phase error. This phase error is averaged and decimated over a predetermined number of potential symbol transitions in the received signal. The output phase error is provided from a block (815) on a line (817) to a loop filter. This output is provided only once for each decimation operation such that the loop filter can operate at a lower clock rate. The phase error output is then utilized to select one of multiple clocks that correspond to the phase error, these being incremental phase clocks referenced to a master clock. This utilizes a clock multiplexer (1427) to select one of the multiple clock inputs which are delayed in phase off of the master clock. This selection is synchronized with the receive clock output of the multiplexer (1427) with the original output phase converted to gray encoded values. The ensures that only a single bit will be changed for any phase change such that only a single bit error will occur corresponding to a single value error.

18 Claims, 11 Drawing Sheets

TIMING RECOVERY SYSTEM FOR A 10 BASE-T/100 BASE-T ETHERNET PHYSICAL LAYER LINE INTERFACE

CROSS-REFERENCE TO RELATED APPLICATION

This application claims the benefit of U.S. Provisional Patent Application filed on Apr. 24, 1998, Ser. No. 60/082,917, which is application with U.S. patent application Ser. No. 60/082,919, entitled, "OUTPUT DRIVER FOR A 10BASET\100BASETX ETHERNET PHYSICAL LAYER LINE INTERFACE" and U.S. patent application Ser. No. 60/082,918, entitled "EQUALIZER FOR A 10BASET\100BASETX ETHERNET PHYSICAL LAYER LINE INTERFACE".

BACKGROUND OF THE INVENTION

Local area networks (LAN) are utilized to interconnect computers, terminals, word processors, facsimile and other office machines within a facility. Although a definition of a local area network can encompass many systems, it is typically directed toward systems that provide for high-speed transmission with typical data rates in the range of 50 Kb\s to 150 Mb\s, which utilizes some type of switching technology and is embedded within some form of network topology. The various technologies necessary to implement a local area network include transmission, switching and networking.

Local area network transmission is achieved in many ways, by transmitting over coax, twisted pairs or even optical fibers. Some of these mediums, such as the twisted pair medium, are limited in bandwidth. The media is utilized to transmit data, with the data being transmitted in the baseband. Typically, data rates as high as 100 Mb/s have been transmitted by using baseband coding techniques such as Manchester Coding, the most prominent of which is the Ethernet, which provides for transmission at either a 10 BASE-T or 100 BASE-T. These are well known standards.

When transmitting data over an Ethernet Interface, the data is transmitted as a sequence of "symbols" which involve transmission of logic states at different levels. In one technique, a multi-level technique, a symbol can be at a positive level, a zero level or a negative level. The next symbol will be at the same level or will be at a different level yielding a transition between the two symbols. When transmitting the sequence of symbols, bandwidth is a consideration due to interference that occurs over the line from one end to the next. This interference can be due to such things as inter-symbol interference, near-end cross talk, etc. All of this noise will degrade the signal, which degradation must be accounted for. Typical solutions to this signal degradation is to use some type of equalizer, reduce clock jitter, etc.

SUMMARY OF THE INVENTION

The present invention disclosed and claimed herein comprises a timing recovery system for recovering timing information from a received data signal having multi-level data therein. The timing recovery system includes a phase encoder for determining the phase of the received data signal relative to a master clock signal. A phase error device is provided for determining the error between an output phase value and the phase of the received data signal in order to generate a phase error for each transition in the received data signal. The phase error device includes an averaging device for averaging the determined phase error value for each received transition in a decimation window. A decimation window has a predetermined potential transition length. A decimator is also provided for outputting the averaged phase error value from the averaging device at the end of each decimation window as the output phase value. A receive clock generator is provided to generate a clock having a phase value relative to the master clock equal to the phase error output by the decimator.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1A:
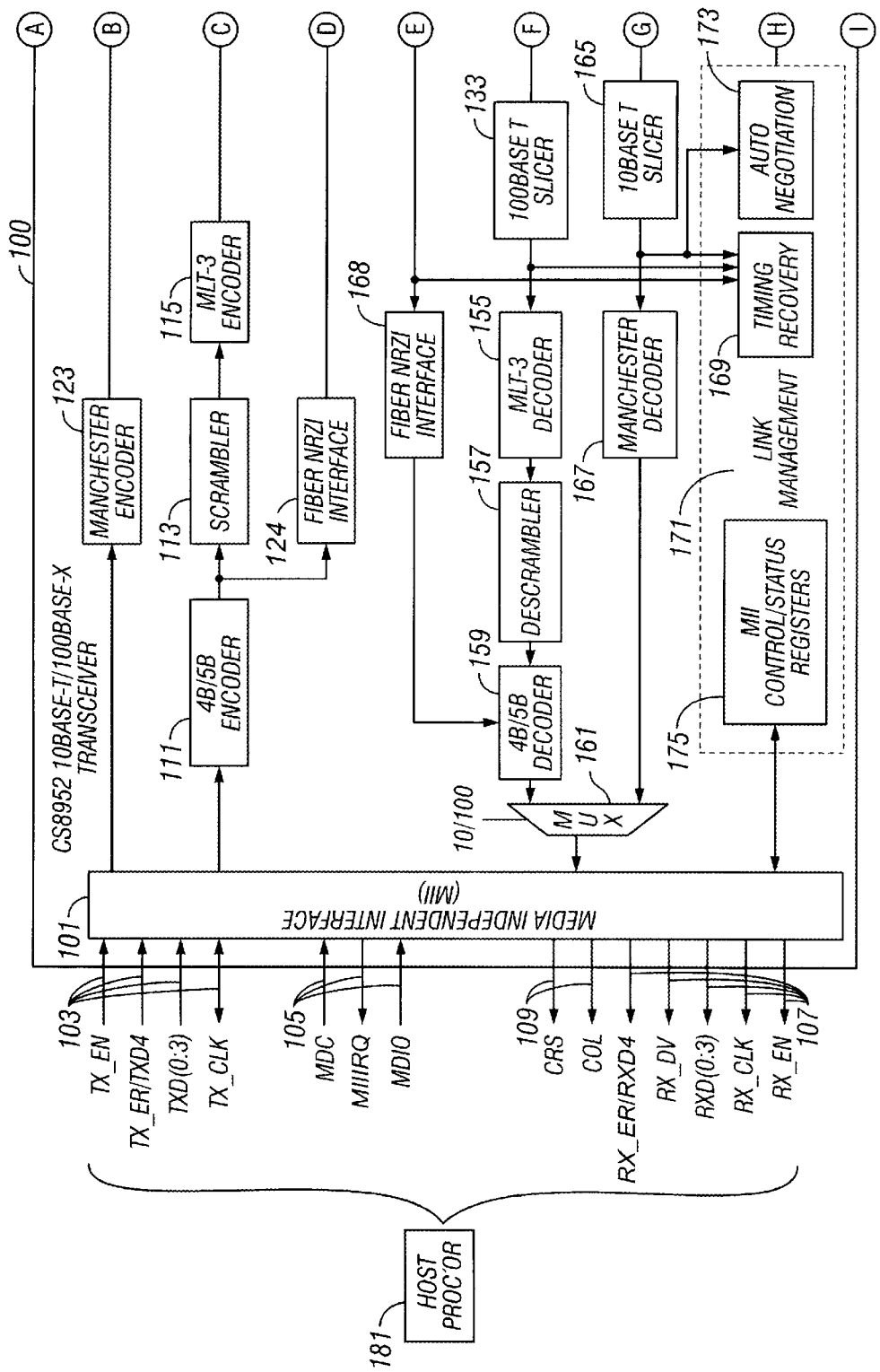
FIG. 1 illustrates an overall block diagram of the transceiver.
Figure 1B:
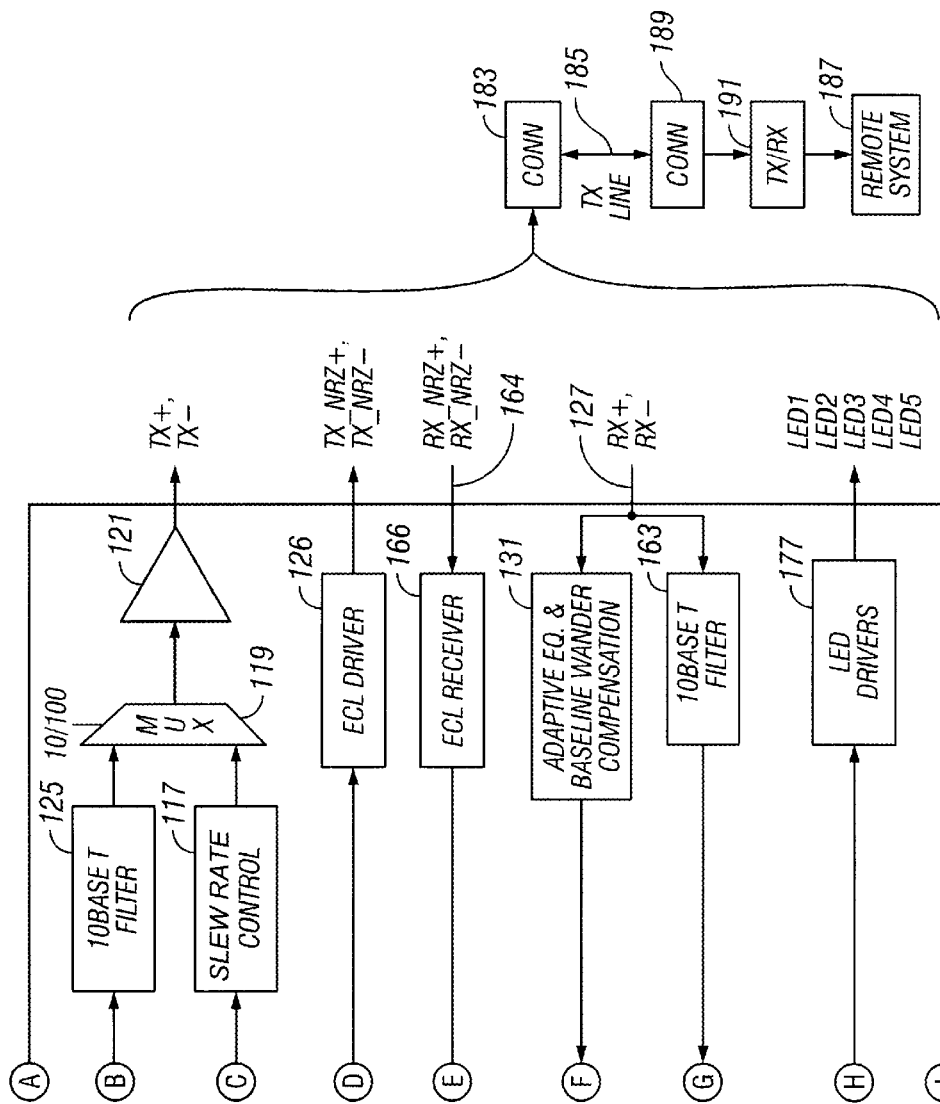

Referring now to FIG. 1, there is illustrated a block diagram of an Ethernet Transceiver for 100 BASE-X and 10 BASE-T applications. In general, it provides a physical coding sublayer for communication with an external Media Access Controller (MAC). The primary digital interface to the transceiver is an enhanced IEEE 802.3 Media Independent Interface (MII) 101. The MII 101 supports parallel data transfer, access to internal control and status registers of the transceiver and several status and control pins associated therewith. The MII 101 has various interface pins associated therewith. These are divided into a number of classes. There are provided seven transmit interface pins 103 comprised of four transmit data pins, these providing a parallel data path, a transmit clock, TXCLK, a transmit enable pin, TXBN, which indicates when transmit data is present and valid, and a TXER\TXD4 pin which is a pin for requesting to transmit a 100 BaseTX HALT symbol. There are provided three register access pins 105, which provide a bidirectional serial data path, MDIO, a clock for the MDIO, MDC, which has a 16.7 MHz maximum frequency, and an MIIRQ interrupt pin for indicating a change in register status. There are provided nine receive data pins 107, four receive data pins RXD, a receive clock output pin, RXCLK, a valid receive data pin, RXDV, indicating when receive data is presently valid, a receive data error pin, RXER\RXD4, and a receive enable pin, RXEN, which is used to tri-state the receive output pins. There are also provided two status pins 109 which provide collision indication COL, and a carrier sense indication, CRS.

The MII Interface 101 provides a 5-bit transmit data path and an independent 5-bit receive data path. In the 100 BaseTX and 10 BaseT modes, 4-bit wide is sent across the MII Interface 101 on TXD[3:0]\RXD[3:0], while TXD4\RXD4 is ignored. In 100 BASE-T mode, 4-bit data is translated into 5-bit symbols transmitted on the medium utilizing an encoding scheme. In the 10 BASE-T mode, the 4-bit data is not encoded/decoded. In the repeater mode, the 5-bit symbol is transmitted across the MII Interface 101 on the TXD[4:0]\RXD[4:0]. A serial management interface is also included to provide access to configuration and status registers.

The MII Interface 101 utilizes TTL signal levels which are compatible with devices operating at a nominal supply voltage of either 5.0 or 3.3 volts. It is capable of supporting either 10 Mb\s, or 100 Mb\s, data rates transparently; that is, all signaling remains identical at associated data rate except the nominal clock frequency.

Transmitted data across the MII Interface 101 is processed in either the 10 BaseT mode or the 100 BaseTX mode. In the 100 BaseTX mode, the data is transmitted to a 4-bit-to-5-bit (4 B\5 B) translator 111 which translates the 4-bit data to the 5-bit symbols transmitted on the medium. This is transmitted to a scrambler 113 which is a stream cipher scrambler. The data is scrambled by the modulo-2 addition of a pseudorandom sequence to the plain text data. The output of scrambler 113 is an input to an MLT-3 encoder 115, the encoded data then input to a slew rate control circuit 117 and into a multiplexer 119. The output of the multiplexer 119 is input to a driver 121 to provide an output.

For the BaseT mode, the data is bypassed around the encoder 111 to decrease latency and the 5-bit symbol is processed through a Manchester Encoder block 123 and then through a filter 125 to the multiplexer 119. The multiplexer 119 selects between the two paths for output to the driver 121. The transceiver of FIG. 1 also provides a path for transmitting data to an optical fiber. The output of the encoder 111 is input to a fiber NRZI interface block 123 and then to an ECL driver 126 to provide on the output thereof the NRZ transmit signals.

In the receive mode, data will be received from the twisted pair on an input line 127 and processed along two paths, one path associated with a 10 BaseT mode and one path associated with the 100 Base-X mode. In the 100 Base X mode, the signal is first received by an adaptive equalizer 131 which is operable to process the receive signal through an equalizer function, as will be described hereinbelow in more detail. This block 131 also provides base line wander compensation, which will also be described hereinbelow.

The output of the block 131 is then processed through a 100 Base-X slicer 133 and then to an MLT-3 decoder 155. This is then processed through a descrambler 157. The descrambler allows plaintext to be recovered by subtracting off (modulo 2) the identical pseudorandom sequence that was added to the ciphertext. This is then passed through a 5-bit-to 4-bit (5 B4 B) decoder 159 and then to the input of a multiplexer 161. The output of the muitiplexer 161 is then put to the MII interface 101. For the 10 BaseT path, the received signal is input to a filter 163, the output thereof processed through a 10 BaseT slicer 165 and the output thereof processed through a Manchester decoder 167. The output of the Manchester decoder 167 is input to the other input of the multiplexer 161, the multiplexer 161 controlled by a control signal for selecting the paths.

For an optical fiber, the receive signal is received on an input 164, which is input to an ECL receiver 166, the output thereof input to a fiber NRZI interface 168. The output of the interface 168 is input to the 5 B/4 B decoder 159.

The clock recovery is performed by a timing recovery block 169, which receives the inputs from the output of the slicers 133 or 165, depending upon the path selected, and from the output of the ECL receiver 166 when the data is transmitted over a fiber optic node. The timing recovery block 169 is operable to recover the clock and timing information contained in the received signal. The timing recovery block 169 is part of a link management block 171, which also contains an auto-negotiation block 173. Auto-negotiation is the mechanism that allows the two devices on either end of an Ethernet link segment to share information that automatically configures both devices for maximum performance. The transceiver in the auto-negotiation mode will detect and automatically operate full-duplex at 100 Mb/s if the device on the other end of the link segment also supports full-duplex, 100 Mb/s operation, at auto-negotiation. The auto-negotiation capability is fully complied with the relevant portions of Section 28 of the IEEE 802.3u standard.

In the auto-negotiation mode, the transceiver can auto-negotiate both operating speed (10 vs. 100 Mb/s) and duplex mode (half duplex vs. full duplex), or alternatively can receive instructions indicating that the transceiver is not to negotiate. This feature is selected via the state of two input pins AN0 and AN1 (not shown). The link management layer also contains control and status registers in a block 175 which are utilized by the MII interface 101. The link management control 171 is operable to provide outputs on five LEDs which are driven by a driver block 177.

Figure 2A:
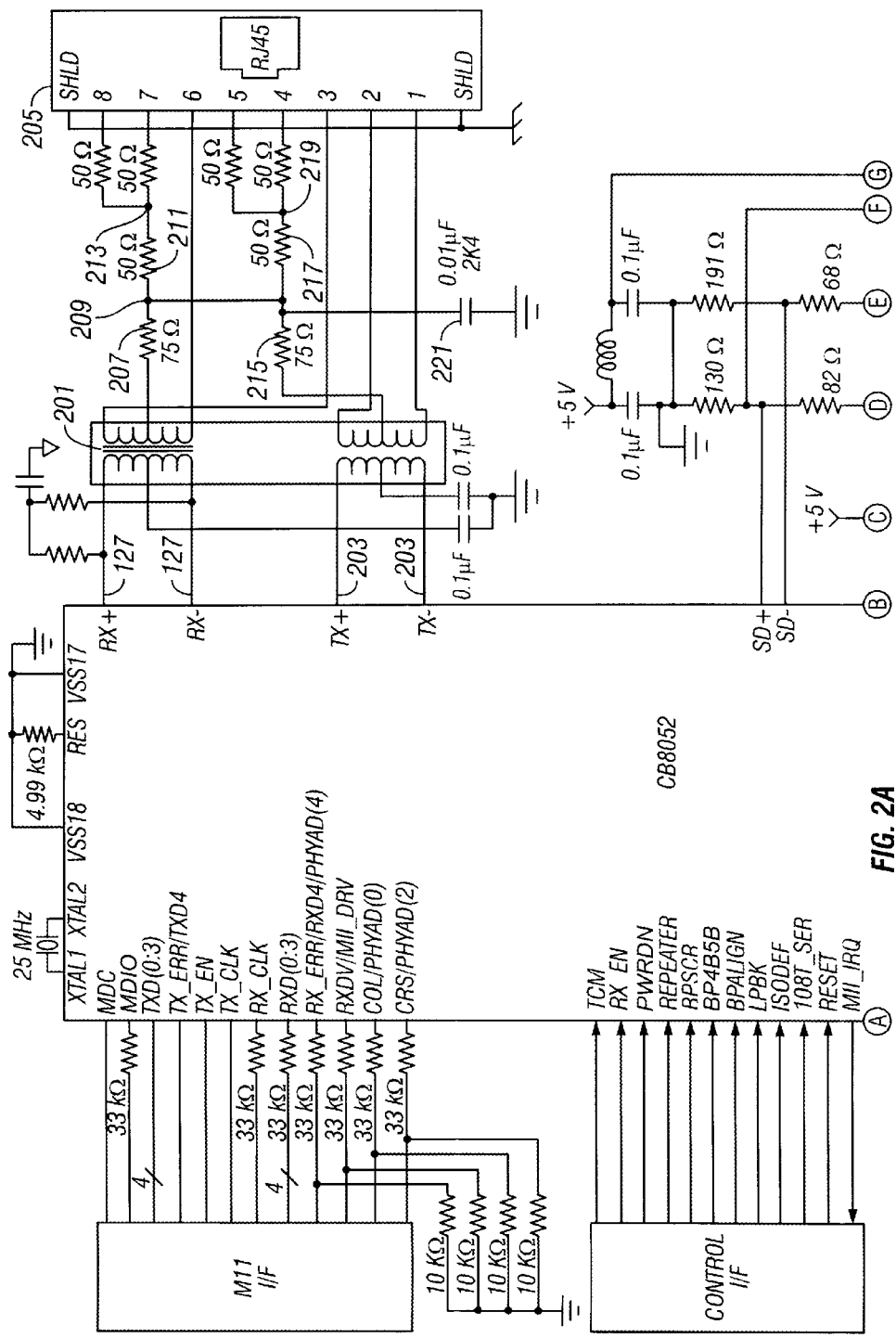
FIG. 2 illustrates an interconnection diagram for both the twisted wire pair and the fiber optic connection.
Figure 2B:
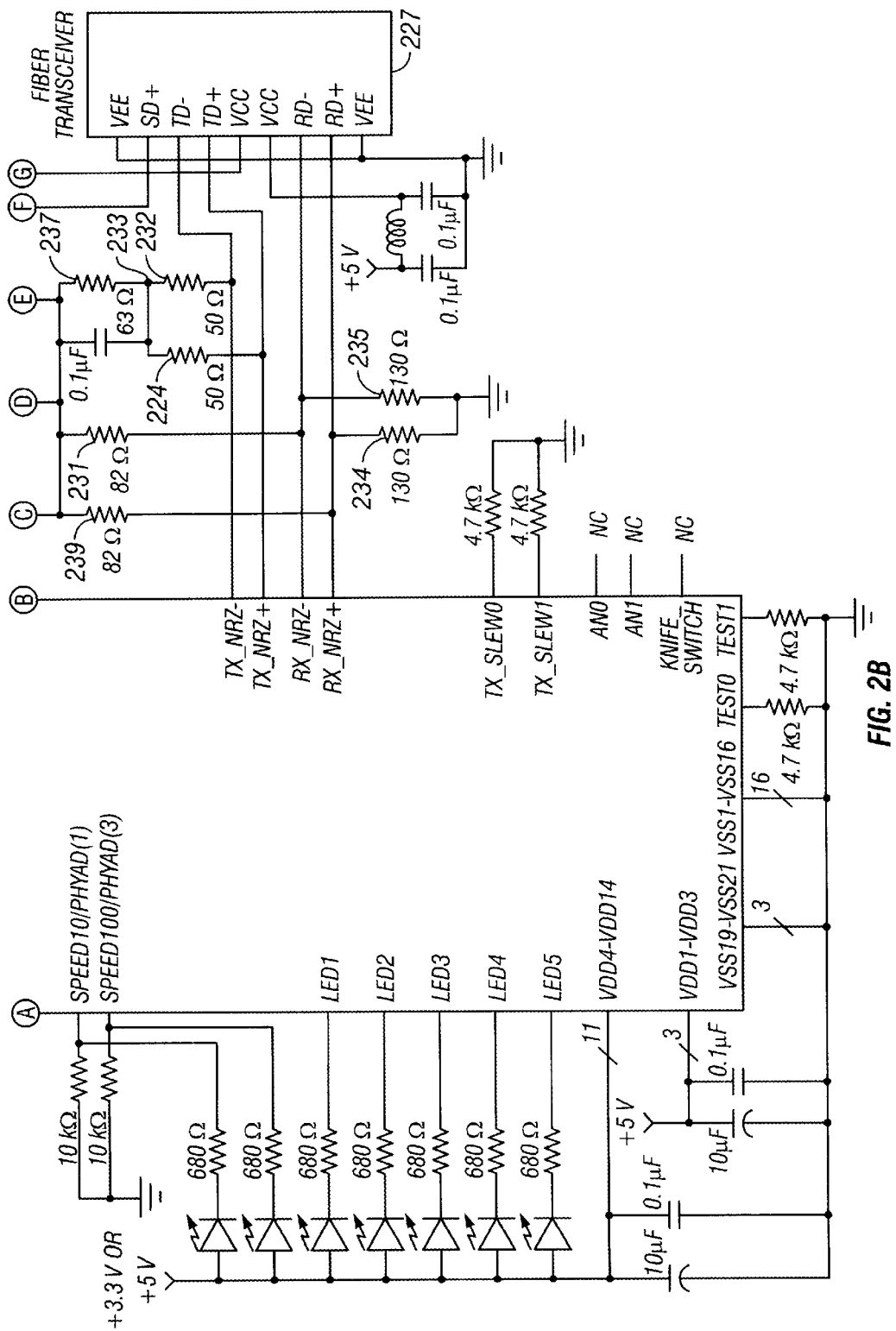

Referring now to FIG. 2, there is illustrated an interconnection diagram for the transceiver connected to a twisted wire pair and also connected to a fiber optic interface. The receive terminals 127 are connected to a transformer 201, there being a positive and a negative receive terminal. Similarly, transmit terminals 203 are also connected to the transformer 201. The transformer 201 is operable to provide on the opposite side thereof two balanced outputs associated with the receive input which are connected to two terminals of an RJ45 connector 205. The center tap of the transformer on the connecter side of the transformer 201 is connected through a first series resistor 207 to a node 209, node 209 connected through a second resistor 211 to a node 213. Node 213 is connected through a first resistor to one terminal of the connector 205 and through a second resistor to the connector 205. Resistor 207 is 75 Ohms in value and the remaining resistors 211 and the two resistors connected to node 213 are 50 Ohms.

The other side of the transformer 201 for the transmit signal are comprised of two balanced outputs and a center tap output. The two balanced outputs are connected to two pins on the connector 205 and the center tap is connected through a first resistor 215 to the node 209, node 209 also connected through a second resistor 217 to a node 219. Node 219 is connected through two resistors to two separate pins on the connector 205. A capacitor 221 is connected between node 209 and ground. Resistor 215 is the same value as resistor 207 and resistor 217 is the same value as resistor 211, the remaining two resistors connected to node 219 also being the same value as resistor 217.

The fiber optic transmit terminals from ECL driver 126 and the receive terminals 164 are input to a fiber optic transceiver 227. The transmit terminals are differential outputs and are connected through two resistors 224 and 232 to a node 233. Node 233 is connected through a resistor 237 to the positive supply. The receive input 164 is a differential input having two wires connected through respective resistors 239 and 241 to the positive supply and through two respective resistors 234 and 235 to ground.

Figure 3:
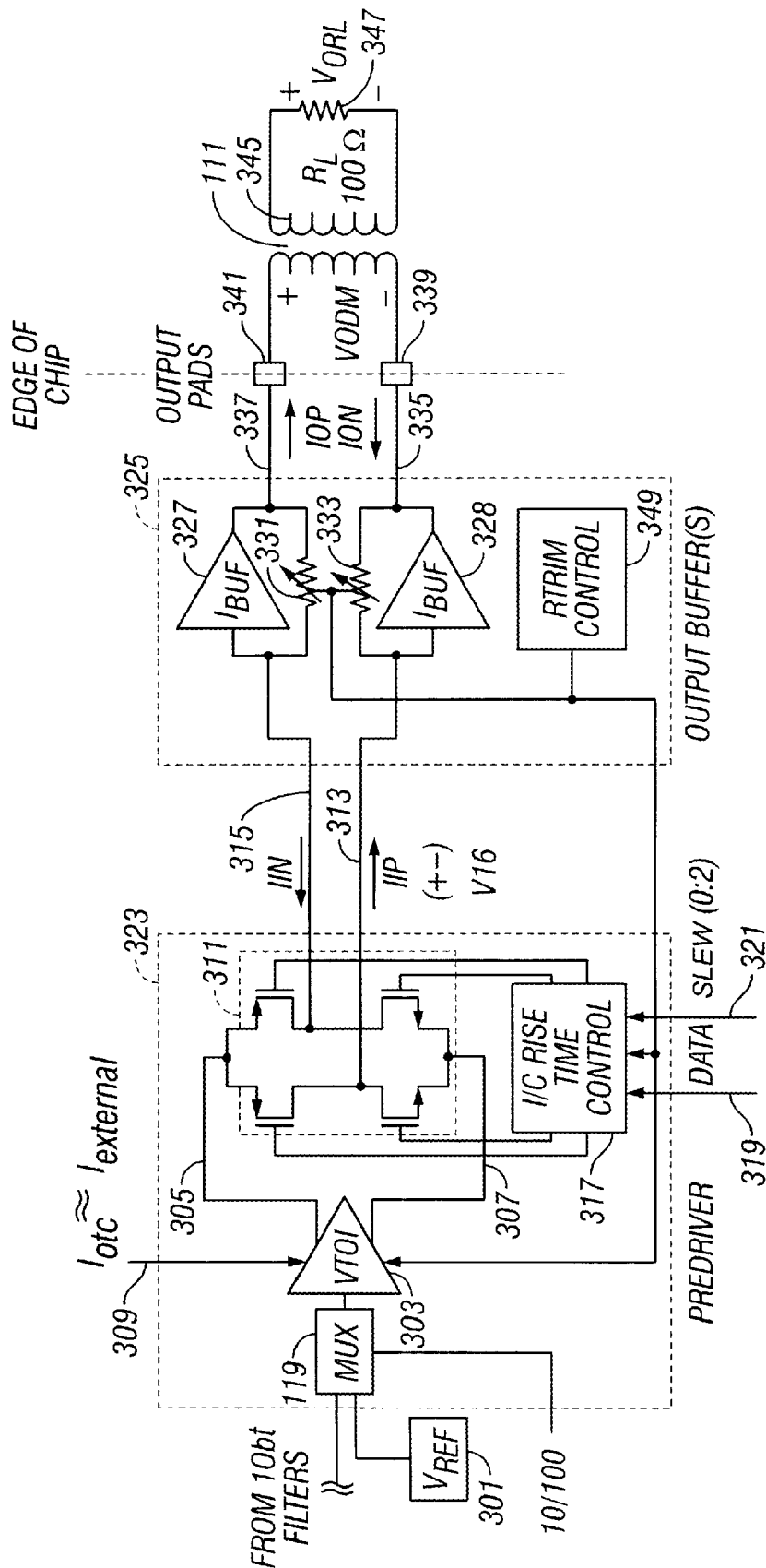
FIG. 3 illustrates a circuit diagram for the output buffer.

Referring now to FIG. 3, there is illustrated a circuit diagram for the output buffer 121. The output-buffer 121, as described hereinabove, operates in two modes, it operates to receive the 10 BaseT mode or in the 100 BaseTX mode. In the 10 BaseT mode, the encoded signal is received from the filter 125 and then is processed in a conventional manner, as will be described hereinbelow. In the 100 BaseTX mode, a reference voltage $V_{REF}$ indicated in a block 301 is selected by the multiplexer 119. The output of the multiplexer 119 is input to a voltage-to-current converter 303 which is operable to provide on the output thereof two differential currents on lines 305 and 307, respectively. Additionally, as will be described in more detail hereinbelow, the V-to-I converter 303 is operable to receive a zero temperature coefficient current $I_{Otc}$ on a line 309 which is summed with the current generated by the V-to-I converter 303. This current is then input to a current switch 311 which current switch 311 is operable to switch the current in a predetermined manner to provide on the output thereof a positive current on a line 313 and a negative current on a line 315. The current switch 311 is controlled by a rise time control circuit 317, which is operable primarily in the 100 BaseTX mode to receive data on a line 314 and provide switching in such a manner to minimize distortion, as will be described hereinbelow. In addition, the rise time control circuit 317 provides a slew to the signal which is programmable in response to a 3-bit slew input, on a line 321. The V-to-I converter 303 and the current switch 311 comprise a pre-driver 323.

The output of the pre-driver 323, the current on lines 313 and 315, is input to an output buffer section 325. The output buffer section 325 includes first and second current buffers 327 and 328, the current buffer 327 having a trimmable internal impedance 331 associated therewith and the current buffer 328 having a trimmable output impedance 333 associated therewith. The current buffer 328 is operable to receive on the input thereof the current on line 313 and provide on the output thereof a current $I_{on}$ for the negative output current on an output line 335. The current buffer 327 is operable to receive on the input thereof the current on line 315 and provide on the output thereof an output current $I_{op}$ on a line 337. Line 335 is connected to a terminal 339 and line 337 is connected to a terminal 341, terminal 339 being the negative terminal and terminal 341 being the positive terminal. This is input to a 1:1 transformer 345, which has a load resistance 347 disposed thereacross on the opposite side to the terminals 339 and 341. This provides the voltage $V_o$ across resistor 347. The internal impedances of buffers 327 and 328, represented by resistors 331 and 333, are trimmable as well as the operation of the V-to-I circuit 303. This is provided by a trim control circuit 349.

Figure 4:
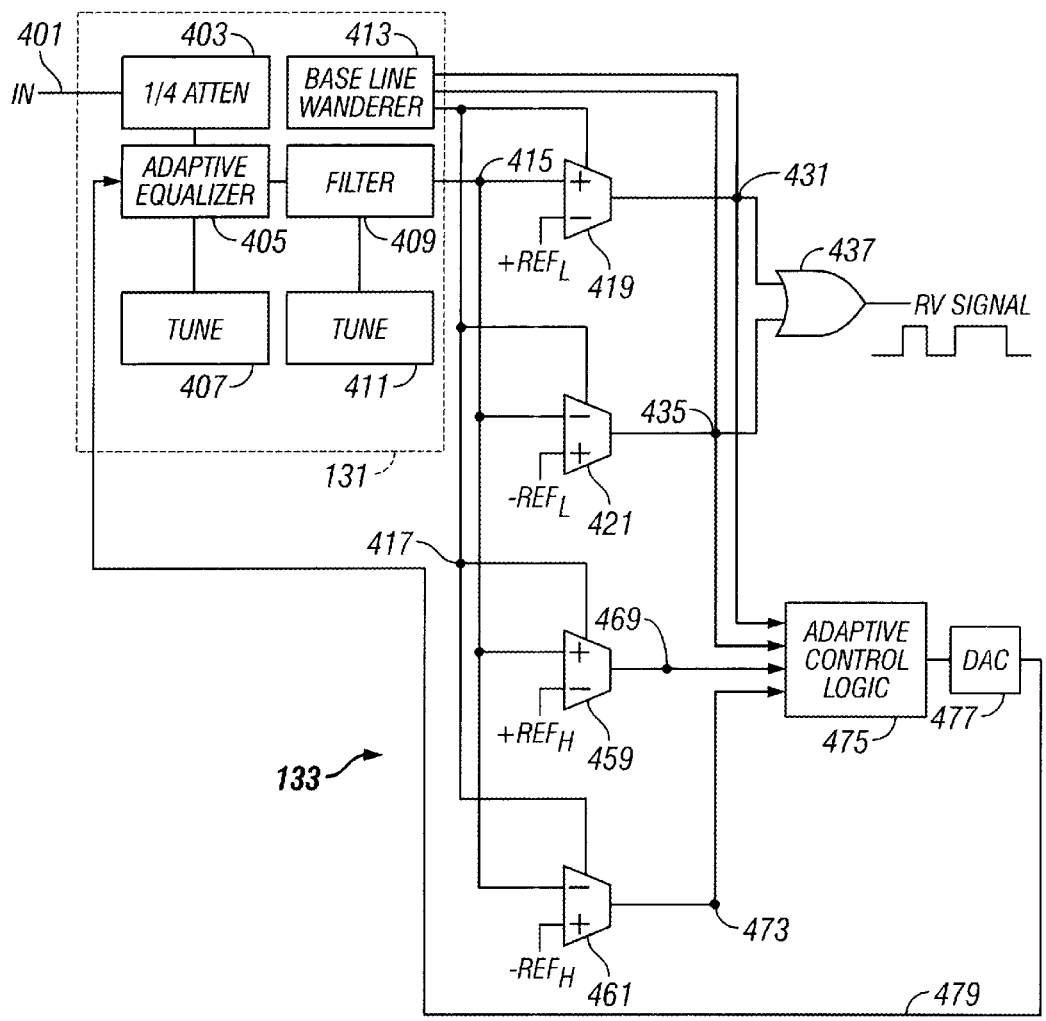
FIG. 4 illustrates a logic diagram for the equalizer and slicer.

Referring now to FIG. 4, there is illustrated a logic diagram for the adaptive equalizer and baseline wanderer circuit 131 and the slicer 133. The input signal is received on a line 401, which input signal is, as described hereinabove, an MLT-3 signal. The input signal is input to the adaptive equalizer and baseline wanderer circuit 131, initially to an attenuator 403 which is operable to provide a ¼ attenuation level. This attenuated signal is then output to an adaptive equalizer 405, which will be described in more detail hereinbelow and which is tuneable with a tuning circuit 407. The output of the adaptive equalizer 405 is input to a filter 409, which is tuneable with a tuning circuit 411. The output of the filter 409 is input to a baseline wanderer circuit 413 and also to a node 415, which node 415 will drive the slicer 133. The baseline wanderer 413 is a circuit that is operable to provide a compensation output on a node 417 that will compensate for situations wherein a large number of logic "1" or "−1" states exist. Since the transmission system utilizes a balanced line, there could be a DC drift associated therewith. Since the general level is known, this baseline wanderer circuit 413 will provide compensation for this.

Figure 5:
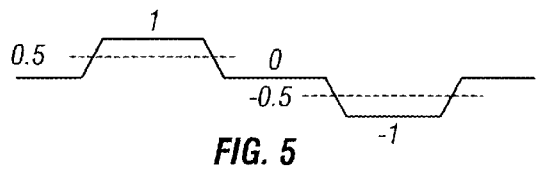
FIG. 5 illustrates a timing diagram for an MLT-3 signal with threshold detection for the slicer operation.

With reference to FIG. 5, there is illustrated a waveform illustrating a "+1", followed by "0", followed by a "−1" logic state for an MLT-3 signal. The slicing operation essentially utilizes a mid-level threshold voltage of 0.5 volts, above which it makes a decision as to whether the signal is a "+1" logic state and, when it is below a −0.5 volt threshold, it makes a decision that it is a "−1" logic state. The +0.5 volt and −0.5 volt thresholds are selected as this is one-half of the +1.0 volt and −1.0 volt maximum levels for the "1" and "−1" levels respectively.

With further reference to FIG. 4, the slicing function is provided by two comparators 419 and 421. Comparator 419 receives the signal from filter 409 on node 415 on a positive input with the negative input of the comparator 419 connected to a positive reference voltage. In the preferred embodiment, this positive reference voltage, labeled +$Ref_L$, is approximately +0.125 volts. The ideal threshold would be 0.500 volts, but, due to the attenuation of block 403, this is reduced by a factor of four. However, it should be understood that this reference voltage could deviate from the nominal for optimization or tuning purposes. The comparator 419 will therefore provide an output whenever the received signal rises above the threshold level such that a "+1" level will be detected and a pulse output on a node 431. A second comparator 421 is provided for detecting the negative going level, i.e., transitions from a "0" to a "−1," which comparator 421 receives on the negative input thereof the signal on node 415 and a reference voltage on the positive input. This reference voltage, labeled −$Ref_L$, is nominally −0.125 volt, The output of comparator 420 is provided on a node 435. This is a positive going pulse that is generated whenever a transition from a "0" to a "−1" occurs. The node 431 and the node 435 are both input to an OR gate 437, the output thereof providing the received signal, which received signal basically represents all of the transitions that occur between levels, i.e., it is a series of transitions such that whenever going from a "+1" to a "0" from a "0" to a "−1," there will be a positive going transition. Whenever going from a "−1" to a "0", there will be a negative going. transition.

For the purpose of adaptively controlling the adaptive equalizer 405, there are provided two comparators 459 and 461. Comparator 459 has the positive input thereof connected to node 415 and a negative input thereof connected to a high level reference voltage, labeled +Ref$_H$, which is nominally +0.250 volts, representing the unattenuated threshold of approximately 1.0 volts, the maximum voltage. The comparator 461 has the negative input thereof connected to node 415 and the positive input thereof connected to a negative high reference voltage, labeled −Ref$_H$, which is nominally −0.250 volts. The outputs of comparators 459 and 461 are input to an adaptive control logic block 475, as well as the signals on nodes 431 and 435.

The baseline wanderer 413 is operable to provide some compensation to each of the comparators 419, 421, 459 and 461. The baseline wanderer circuit 413 receives the signals from nodes 431 and 435 and generates an input to each of the comparators, this being a conventional operation.

Figure 6:
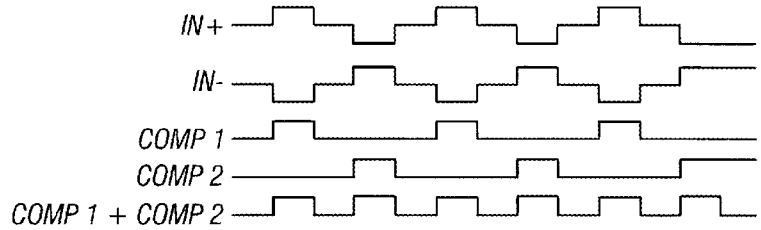
FIG. 6 illustrates a timing diagram for the output of the slicer.

The waveforms for the output signals on node 431 and node 435 is illustrated in FIG. 6, comparator 419 being referred to as "Comp1" and the comparator 421 is referred to as "Comp2." It can be seen that whenever a "+1" is present, the output of comparator 419 goes high, and, whenever there is a "−1", the output of comparator 421 goes high. Therefore, it is only necessary to OR the two outputs together to provide a clock signal. This circuitry is not shown, although it is part of the phase lock loop (PLL) circuitry, as will be described hereinbelow. These waveforms are illustrated in FIG. 6, it being understood that the input signals do not necessarily transition between a "+1", a "0" and a "−1" in that order. There can be any combination of levels with the notation that there can never be transition from a "1" to a "−1" or from "−1" to "+1."

The output waveforms from comparators 459 and 461 will be similar to the waveforms output from comparators 419 and 421, with the exception that they will only exist when the input voltage is above 1.0 volts. Therefore, the combination of the comparators 419 and 421 and the comparators 459 and 461 provide a "window" comparator; that is, none of the comparators 419, 421, 459 and 461 will provide an output unless the voltage is above 0.5 volts. This will result in only comparators 419 and 421 providing an output when the voltage is between 0.5 volts and 1.0 volts. When the voltage is above 1.0 volts, all four comparators 419, 421, 459 and 461 will provide an output. This information is utilized for controlling the adaptive equalizer. The nodes 431, 435, 469 and 473 are input to an adaptive control logic block 475, which is basically an uptown counter, the operation of which will be described hereinbelow. This will provide a digital output value to a digital-to-analog converter (DAC) 477. This value is then input back along analog line 479 to an analog input to the adaptive equalizer 405. This will vary the level of equalization provided by the equalizer 405 as a function of the overall signal level. This, in effect, is the feedback loop similar to an automatic gain control in a pure analog domain.

Figure 7:
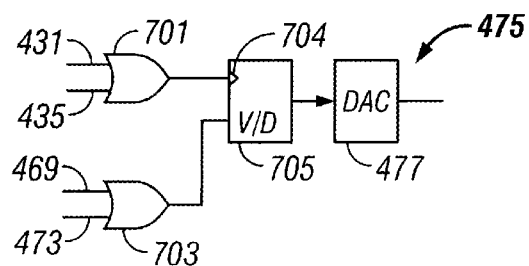
FIG. 7 illustrates a logic diagram for the adaptive control logic.

Referring now to FIG. 7, there is illustrated logic diagram for the adaptive control logic block 475. The two comparator output signals on nodes 431 and 435 are imput to an OR gate 701 and the two outputs on nodes 469 and 473 from the comparators 459 and 461 are input to two inputs of an OR gate 703. The output of OR gate 703 is input to the und up/put input of an up/down counter 705, and the clock input pin 704 is connected to the output of the OR gate 701. Therefore, it can be seen that the counter will be counted up whenever there is no pulse output by OR gate 703 indicating that the adaptive equalizer should have its gain increased. However, when the signal level rises about 1.0 volts, then there will be a clock output from OR gate 703, which will change the direction of a counter and cause it to count down. The output of this counter 705 is then input to the DAC 477.

In operation, it is desirable to have the counter 705 operate in an efficient manner. The majority of the counter 705 operates at a relatively low count rate and, therefore, can utilize a less complex counter. Therefore, one portion of the counter can operate at one clock rate with the other portion of the counter associated with the LSBs operating at the higher input clock rate.

The output of the slicer comprises two clock signals from the nodes 431 and 435, generated by the comparator 419 and 421. As described hereinabove, the comparator 419 generated a pulse relating to the "+1" level and the comparator 421 outputs a level whenever a "−1" level is received, each of these being received during a symbol period. Therefore, if the MLT-3 encoded signal were in a sequence +1, 0, −1, 0, +, 0, +1, 0, +1, 0, . . . , this would result in a series of pulses of a one symbol duration and separated by one symbol. This, of course, is the two waveforms ORed. The clock rate of the symbols is the symbol clock rate at the transmitter which is the clock rate at the receiver on the receive signal. It is desirable that the receiver operates at that receive clock. There is provided at the receiver a master clock running at a frequency of 125 MHz, which is not inherently synchronized with the clock rate of the received data. The master clock is used to create another clock signal which is synchronous with the received data. This is done by creating sixteen phases of the master clock and choosing the phase that is closest in synchronicity with the received data. In general, the master clock and the received clock are asynchronous. This will create a clock boundary, i.e., this constituting part of the circuit where signals created by one clock are clocked by the other. In particular, the received clock phase information is created by the master clock, and clocked by the received clock.

Figure 8:
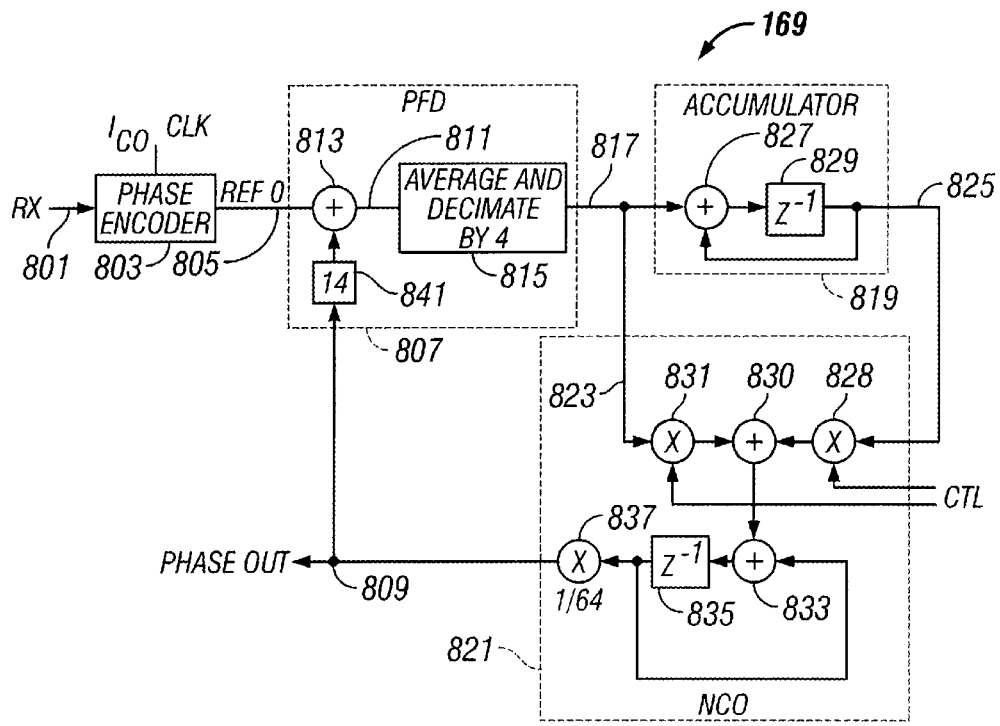
FIG. 8 illustrates a block diagram of the digital PLL.

Referring now to FIG. 8, there is illustrated a block diagram of the digital phase lock loop that constitutes the heart of the timing recovery system 169 of FIG. 1. The ORed data is received from the slicer 133 on line 801 comprising the logical OR of the outputs of comparators 419 and 421. This is input to a phase encoder block 803, which phase encoder block 803 is operable to generate a data phase on an output line 805. The data phase is a comparison of the phase of the received signal to that of a master based clock signal, the I$_{CO}$ clock, this being the symbol clock at a frequency of 125 MHz in the preferred embodiment. As will described hereinbelow, the phase encoder 803 is segmented into sixteen segments of a symbol period such that the line 805 contains four bits of information representing one of these sixteen segments. The received data is compared with the sixteen phases of the master clock, and a four-bit number corresponding to the nearest of the sixteen phases is output.

The signal on line 805 constitutes a digital data phase. This is input to a phase frequency differentiator block 807, which is operable to compare an output phase on a node 809 to the data phase value. As will be further described hereinbelow, the difference between the data phase and the output phase on node 809 is determined in order to generate a phase error on a line 811, a difference block 813 utilized for the difference. The output on node 809 is operated at one-fourth the clock rate of the received data for the purpose of allowing the loop filter and processing section to operate at a slower rate, due to the computational complexity. Therefore, the phase error on line 811 must be decimated by a factor of four in a decimation and averaging block 815 and then output on a decimated reference phase error line 817. However, prior to decimating, the phase error is first averaged over the four possible values to ensure that all relevant information is retained. This decimated reference phase error is then input to a loop filter, this being a conventional operation for a phase lock loop. This loop filter function is realized with an accumulator 819 and an NCO 821, the NCO 821 a numerically controlled oscillator. The input to the NCO 821 is comprised of two paths, a direct path on a line 823 and an integrated output on a line 825. The integrating function is provided by an accumulator which is comprised of a summing junction 827 and a delay block 829. The decimated phase error is summed with the output of the delay block 829, and the sum thereof input to the delay block 829. This integrated output is input to a multiplier block 828 which is operable to multiply select the associated output with a control signal and modify the values thereof and then input the signal to a summing junction 830 and then input it to an accumulator similar to the accumulator described above with reference to blocks 827 and 829. Alternatively the summing junction 830 can receive the output of a block 831 which receives the direct decimated reference phase error on line 823 which is multiplied by a control signal before input to the summing junction 830. The output of summing junction 830 is input to a summing junction 833, which is operable to sum the output of summing junction 830 with the output of a delay block 835. The output of summing junction 833 is input to the delay block 835. The output of the delay block 835 is input a scaling block 837 which is operable to scale the number by a factor of 1/64. This scaling block 837 then provides the output phase on node 809.

Figure 9:
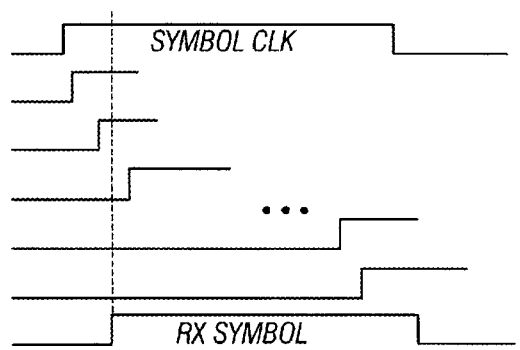
FIG. 9 illustrates a timing diagram for the phase encoder.

Referring now to FIG. 9, there is illustrated a timing diagram illustrating the operation of the phase encoder 803. The phase encoder 803 receives a general reference for the master clock operating at the symbol clock frequency, which is referred to as the $I_{CO}$ clock. The master reference clock is comprised of sixteen internal clocks that are delayed from a reference edge by a predetermined incremented value such that each increment is approximately 1/16th of the symbol clock. A comparison is made between each of sixteen generated clocks and the receive signal on line 801. When the rising edge of the received data symbol on line 801 occurs after one clock segment and before the next clock segment, then the value of the immediately preceding clock segment is output as the data phase value represented by a 4-bit number. This will therefore provide a data phase signal quantifying the phase difference between the $I_{CO}$ clock and the received signal that will have a resolution of 1/16th of a symbol clock period.

The data phase information on line 805 is determined for each pulse received, which pulse is received only when there is a transition from a "0" to a "+1" to a "−1" (or vice versa) and, as such, the received waveform may have large intervals when there is no transition received. For example, if there were a number of "+1" symbols received, there would be no transition. As such, there must be some type of sample and hold operation that is performed. In order to accommodate for this, a sample is taken at every "potential" transition and, if there is no transition, then the previous value is utilized as the phase reference value. As described hereinabove, the phase error on line 817 is only generated once very four symbols. However, if there is more than one transition received during the four symbol time window, then the value for the reference phase is averaged, prior to decimating.

Figure 10:
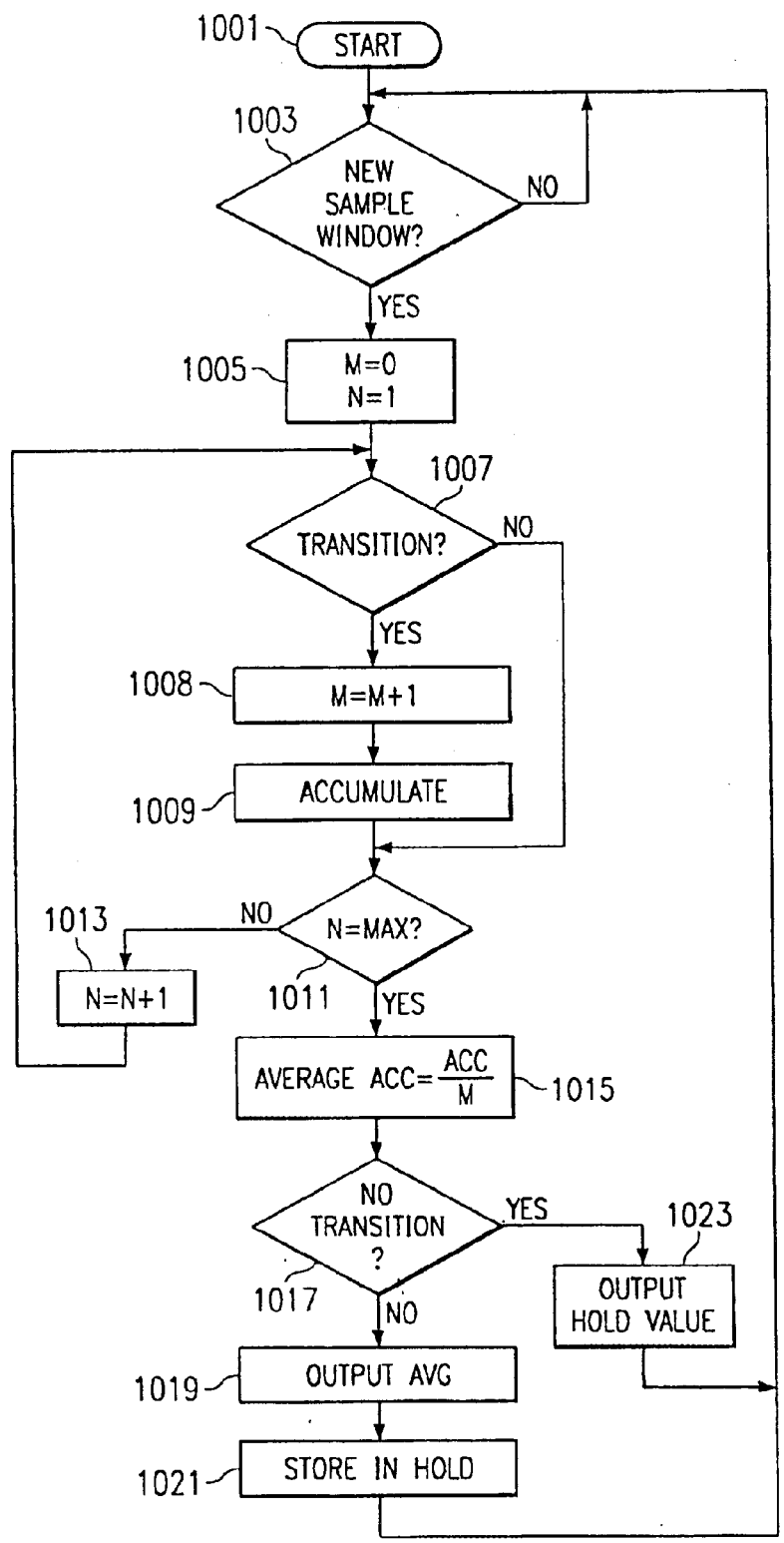
FIG. 10 illustrates a flow chart for the averaging operation in DPLL.

Referring now to FIG. 10, there is illustrated a flow chart depicting the above noted average and decimation operation performed by block 815. The program is initiated at block a 1001 and then proceeds to a decision block 1003 to determine if a new sample window has been initiated. If so, the program will flow along the "Y" path to a block 1005 to set the sample value N within the window to "1" and the number of transitions M in the window equal to "0." Until the sample window has been generated, the program will flow back around an "N" path to the input of a decision block 1003. Once the value of N and M have been initialized at "1," the program flows to a decision block 1007 to determine if a transition has occurred. If so, the program will flow along a "Y" path to a block 1008 to increment the value of M by "1" and then to a block 1009 to accumulate the reference phase error associated therewith and then to a decision block 1011 along the "N" path. If no transition has been detected, i.e., there was no transition from one level to another, then the program would proceed to the decision block 1011. The decision block 1011 determines if the value of N is equal to the maximum for the window, that being four in the present embodiment. If it is not at a maximum value, the program will flow along an "N" path to a function block 1013 to increment the value of N and then to the input of decision block 1007 to determine if, during the next symbol period, a transition occurs. This will continue until all N samples have been made and the accumulator will then have a value equal to the sum of the transitions. Of course, if no transitions occurred, the value would be zero. The program will then flow from the decision block 1011 along a "Y" path to a function block 1015 to average the values in the accumulator over the number of transitions M and then to a decision block 1017 to determine if that average was zero, i.e., there were no transitions during the sample window. In the preferred embodiment, if the value of M is "3", then the average is made using a value of "4" for M. If there was at least one transition, the program will flow along an "N" path to a function block 1019 to output an averaged value and it will store this average value in a hold register, as indicated by block 1021, and then proceed back to the input of decision block 1003 to wait for the next sample window. Of course, if there were no transitions, the program would flow from the decision block 1017 to function block 1023 to output the previous value from the hold register and then back to input of decision block 1003.

Once the phase error on line 801 of the difference block 813 is averaged and decimated by the block 815, it can then be passed to the loop filter section for processing. This processing is performed at one-fourth the clock rate of the master clock. In so doing, less complex circuitry can be utilized for the processing function. The output of the loop filter block, the output of the scalar 837, then provides a reference phase value which is required to be subtracted from the reference phase output by the phase encoder 803. However, this value is only updated once every four clock cycles of the master clock input to the phase encoder 803. Therefore, this must be a value that is held for at least five clock cycles of the master clock, which is facilitated by block 841. The output of block 841, being held for these four cycles, is then subtracted from the reference value 805 to generate the phase error value on line 811.

Figure 11:
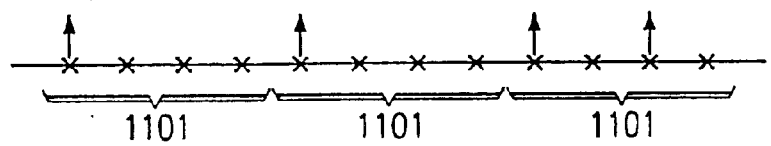
FIG. 11 illustrates a transition plot for the received clock.

Referring now to FIG. 11, there, is illustrated a transition plot of the received data illustrating the potential transitions and the actual transitions for the plurality of time windows 1101. In the first sample window, there are illustrated four possible transitions, of which one is an actual transition. This is the same with respect to the second sample window. Of course, these could be transitions from any level to another level, it being noted that a transition from a "+1" to "−1" is prohibited and the reverse also. In the third sample window 1101, there are illustrated two actual transitions of the four potential transitions. In this sample window, it will be necessary to accumulate the values for both of these transitions and the phase error associated therewith and average these two values. This is to be compared with a system that would merely sample and hold the first value and then ignore the remaining values as shown in the second sample window. It is also noted that there could be a situation where no actual transitions occurred or were present in a sample window, wherein the last stored value would be utilized from a previous window 1101.

Figure 12:
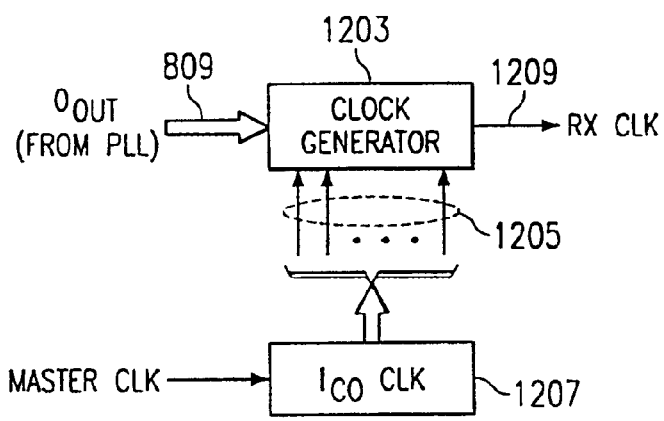
FIG. 12 illustrates a block diagram of the plot multiplexor 4 selecting the appropriate phase closed as a function of the output of the DPLL.

Referring now to FIG. 12, there is illustrated a block diagram of a clock generator which is operable to receive the phase output of the PLL and generate the actual receive clock. The output from the PLL is a 4-bit output on the bus or line 809, which is input to a clock generator 1203. The clock generator 1203 also receives sixteen separate clock signals on lines 1205, which represent 16 incremental phase clocks over one symbol period. These are generated from the master clock via an $I_{CO}$ clock circuit 1207, which is clocked by the master clock. The $I_{CO}$ clock, as described hereinabove, is a clock signal that has a period equal to the symbol period which is 8 nanoseconds. Each of the 16 outputs represents an incremental phase difference. The problem is that this generated receive clock from the output of the clock generator 1203 on a line 1209 is utilized to clock other circuitry and, as such, it is important that this is as accurate as possible.

Figure 13A:
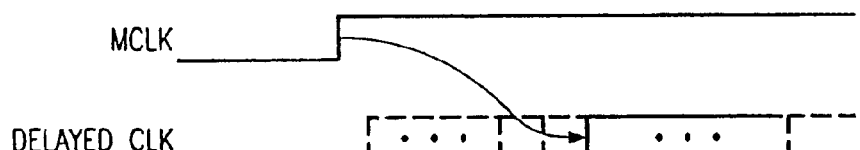
FIGS. 13a and 13b illustrate waveforms for the receive clock illustrating the phase error that can exist on a rising edge of adjacent pulses.
Figure 13B:
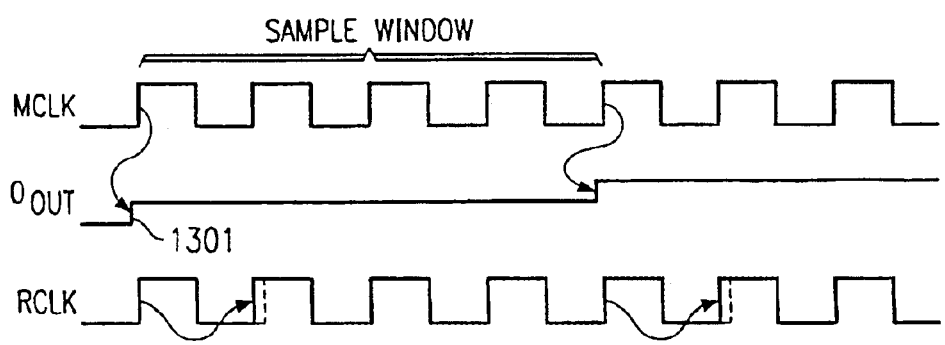

Referring now to FIGS. 13*a* and 13*b*, there are illustrated waveforms depicting the problems existing between the master clock and the receive clock. The master clock is responsible for generating the various delayed phase clocks which are utilized as the output for the receive clock, this facilitated by selecting one of the delayed clocks. However, once a receive clock is constructed from these delayed clock edges from the master clock, this receive clock is utilized to operate the various logic in the subsequent circuitry, i.e., this constitutes the recovered clock from the data. It is important that all circuitry that is operated by the reconstructed receive clock not be subject to changes that are brought about by circuitry synchronized to the master clock. FIG. 13*a* illustrates the master clock that is operable to generate the various delayed clock edges that are output by the block 1207 which comprise one of the multiple clock edges on lines 1205.

With specific reference to FIG. 13*b*, there is illustrated the master clock, which master clock is operable to generate an updated phase output value from phase encoder 803 every four cycles. There is illustrated a first phase output change at edge 1301. It is noted that the output of the phase lock loop on the bus or line 809 is updated on the rising edge of the master clock once every four cycles. This phase change is due to a difference between the phase of the received signal and the phase of the master clock resulting in a change in the phase error. If the phase error changes from one sample window to the next, this will cause a different one of the delayed clocks to be selected for generating the receive clock. Of course, this will also cause the rising edge of the receive clock to change. It can be seen, in the preferred embodiment, that this change is clocked by the receive clock or, it is synchronized to the receive clock edge as compared to the master clock edge. Therefore, whenever there is a phase change, as illustrated in line 1301, the rising edge of the receive clock will clock through that change to select a new clock, which new delayed clock will be selected upon the next rising edge of the receive clock. Therefore, the possibility of the change being synchronized to the master clock is prevented.

Figure 14:
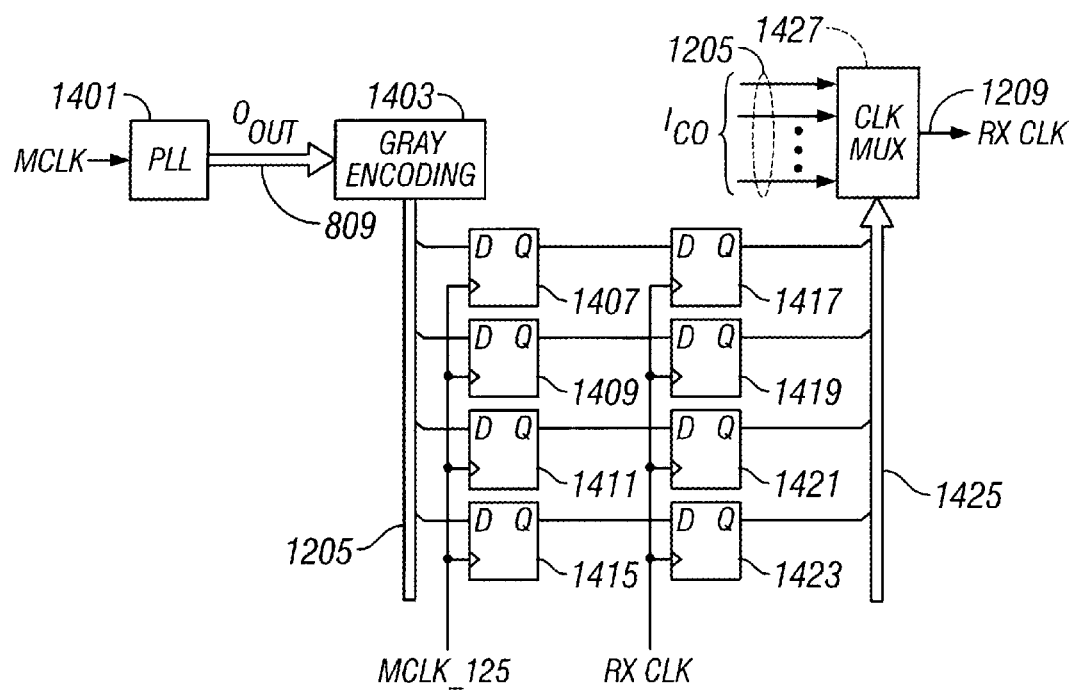
FIG. 14 illustrates a logic diagram for the gray encoding algorithm.

Referring now to FIG. 14, there is illustrated a more detailed block diagram of the clock generator. The phase lock loop is represented by a block 1401 that is operable to utilize the master clock signal and generate the reference phase output on the line 809, this being a 4-bit output. This phase value is utilized to generate the 4-bit phase output value that determines which clock phase of the delayed master clock between 0 and 15 is utilized. The 4-bit value is processed through a Gray encoding block 1403 to impart Gray encoding thereto, for reasons that will be described hereinbelow. This encoded output is provided on a bus 1205 to four master clock D-type flip flops 1407, 1409, 1411 and 1415, representing bit 0–3. These flipflops 1407 are clocked by the clock MCLK. The Q-output of each of the flipflops 1407–1415 are input to respective receive clock flip flops or D-type flip flops 1417, 1419, 1421 and 1423. These flip flops 1417–1423 are clocked by the receive clock and provide on the Q-outputs thereof the 4-bit value that is synchronous with the receive clock and is output on a bus 1425 driving a clock multiplexer 1427, which selects among the I delayed clock inputs on lines 1205. This generates the receive clock on the line 1209.

The Gray encoding block 1403 is operable to account for the problem existing on data which is clocked into flip flops 1407–1415 and then into the flip flops 1417–1423. When this 4-bit value is clocked asynchronously by the receive clock, a spurious result may occasionally be created. This occurs due to the fact that the receive clock may attempt to clock phase information before it has settled and it may only be that 1 bit of the 4-bit value is in error. Although the value of the receive clock phase is designed to vary only by +/−1 (modulo 16) during any clock period, when clocked before it has settled, the intermediate value can be off by as much as +/−8. For example, the transition from 0(0000) to 15(1111), (a transition of −1), could erroneously be clocked as 0111(7), causing a phase sequence of 0, 7, 15. This requires phase jumps of 7 and 8 (rather than +/−1), which can cause errors in the generation of the receive clock.

By utilizing Gray encoding, this will ensure that only a value of +/−1 will be imparted through the phase information in any change. The gray code has a unique property in that values that differ by +/−1 differ in only 1 bit. The following table illustrates this:

TABLE 1

| Value | BCD | GRAY |
|---|---|---|
| 0 | 0000 | 0000 |
| 1 | 0001 | 0001 |
| 2 | 0010 | 0011 |
| 3 | 0011 | 0010 |
| 4 | 0101 | 0110 |
| 5 | 0101 | 0100 |
| 6 | 0110 | 0101 |
| 7 | 0111 | 0111 |
| 8 | 1000 | 1100 |
| 9 | 1001 | 1101 |
| 10 | 1010 | 1111 |
| 11 | 1011 | 1110 |
| 12 | 1100 | 1010 |
| 13 | 1101 | 1011 |
| 14 | 1110 | 1001 |
| 15 | 1111 | 1000 |

By way of example, consider the situation without the Gray encoding wherein the BCD value (0101) is to change to the value (0110), this requiring two bits to change in value. Since the previous value (0101) is already latched in the latches 1407–1415, this then requires the values of the last two latches 1411 and 1415 to change. If there is some error in clocking these two bits through to flip flops 1421 and

1423, only one bit may change, i.e., the value could change from (0101) to (0100), or to (0111). This will, in effect, allow a desired change from a "5" to "6" to be either a "4" a "7." By comparison, the Gray encoding for a "5" will be a change from a (0100) to the value for "6", (0101). The only error can be that it will remain (0100), since only one bit will change. The reason for this is that the first three bits in flip flops 1407–1411 remain the same and, therefore, there is no possibility of an error in clocking them through to the flip flops 1417–1421. The only error that can occur is in the transfer of data from flip flop 1415 to flip flop 1423. Therefore, the only error will be a unit error.

Figure 15:
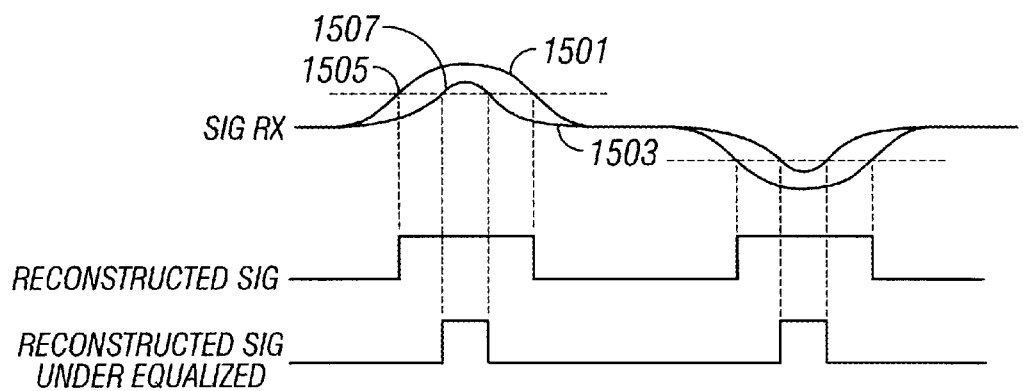
FIG. 15 illustrates waveforms 50, the received waveforms having two different levels due to equalization.

Referring now to FIG. 15, there are illustrated waveforms depicting the receive signal slicer operation that varies from a first relatively fully equalized waveform 1501 to an underequalized waveform 1503. It can be seen that a variation in the equalization will cause the data phase edge for the waveform 1501 at point 1505 to vary to a point 1507 on the waveform 1503. The slicer operation will then generate a pulse output that is wider for the waveform 1501 as compared to the output for the waveform 1503.

Figure 16:
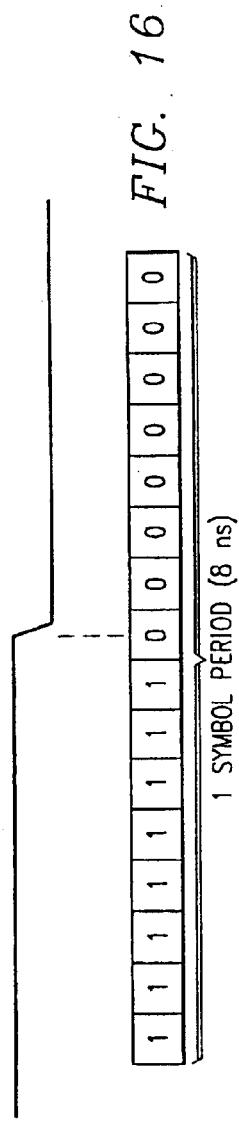
FIG. 16 illustrates the method for sampling the reconstructed signal.

Referring now to FIG. 16, there is illustrated a diagrammatic view of the method for determining where the transition is. Essentially, the symbol period is divided into 16 segments, each operable to sample the slicer output. When the sample changes from a "1" to a "0," this represents a transition: However, it is assumed that the received clock pulse will be at a minimum 8 nanoseconds in length. If the symbol is less than a full 8 nanoseconds, it is possible that both the rising and falling edge can occur in the same sample symbol period. In a sampling operation, if it is a full symbol width, the symbol is sampled four nanoseconds from the rising edge with the phase value determined at the edge with four nanoseconds added before the sample is taken. If, however, the symbol is less than 8 nanoseconds in length, i.e., there are two edges (rising and falling) within a sample period, then the average of the two edges is taken and four nanoseconds abstracted from the two to yield the location of the corrected data phase edge.

Figure 17:
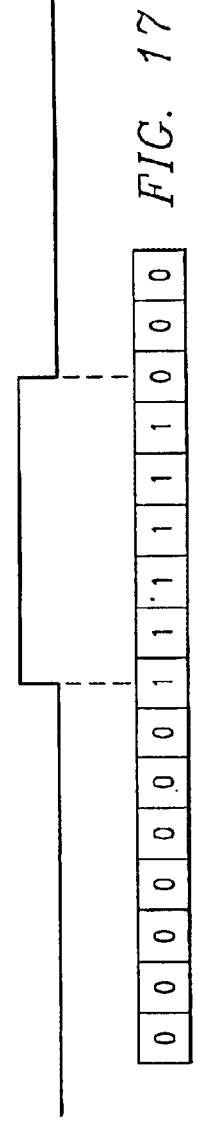
FIG. 17 illustrates the method for sampling and underequalized signal.

Referring now to FIG. 17, there is illustrated the situation wherein a narrow pulse occurs and both a rising and a falling edge fall within the symbol period. In the situation, the rising edge of the narrow pulse does not necessarily represent the ideal edge at which the phase should be determined. In the present invention, a determination is made as the whether to transition occurs within a defined window equal in length to a symbol period and then the rising edge thereof adjusted. This is achieved by, after determining that two transitions occur within the same period, summing the value of the first transition and the value of the second transition, i.e., the position thereof in the defined window, and then dividing this value by 2. This will essentially determine the midpoint of the narrow pulse within the defined window. Thereafter, a value of "4" is subtracted from this midpoint value to move the edge back to the position it would be in were the pulse a full-sized pulse. Therefore, there is a "virtual edge" created from the actual edge, which virtual edge represents that of a full sized pulse. This, in effect, is a pulse stretcher.

Figure 18:
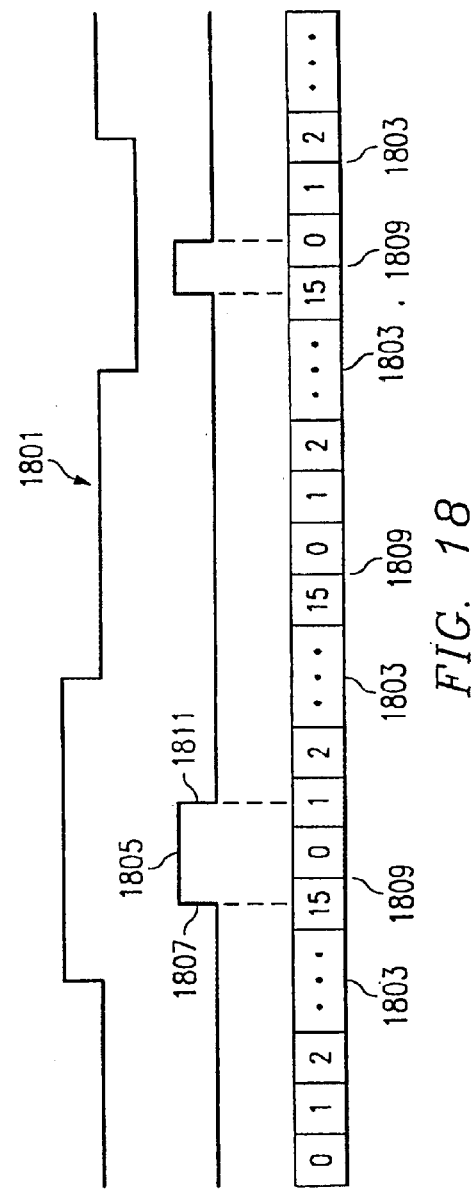
FIG. 18 illustrates the method for averaging unequalized pulses.

Referring now to FIG. 18, there are illustrated waveforms depicting the sampling of the edges for a narrow pulse. There is illustrated a first waveform 1801 that represents an equalized receive signal of an MLP-3 signal for a "+1", a "0" and "–1" symbol sequence. The second waveform illustrates a situation wherein a narrow pulse results, due to underequalization. Shown below the second waveform is a group of symbol windows 1803, each symbol window, as described hereinabove, illustrating the sampling of the transition, the sampling segmented into sixteen individual sampling segments. However, the alignment of the received signal with respect to the symbol windows 1803 is initially random. When this occurs, there is a possibility that a narrow pulse will have the rising edge located in one symbol and the falling edge located in the next symbol. Therefore, there will be no detection of two transitions within the symbo period such that the pulse width can be adjusted. However, the present system will account for this. For example, in the first pulse, labeled 1805, the rising edge, an edge 1807, is aligned with sample "15" in the sample window 1803 therebeneath. There is a border between the two adjacent windows 1803 disposed proximate to the pulse 1805, this labeled 1809. On the other side of the border, the falling edge of pulse 1805, an edge 1811, falls within the sample window "1" that indicates a different value from the previous edge.

It can be seen that edge 1807 will have a value of "15," such that the delayed clock associated with this value will be selected. On the following edge 1811, a different clock edge will be selected. Therefore, the sampling in the two adjacent windows 1803 proximate to pulse 1805 will result in two different phase values being selected. However, as described hereinabove, the phase values are averaged over a predetermined number of symbol periods such that averaging of the two edges will result in the edge being moved to the left. For example, if the value of "15" and "1" were averaged, this would result in the value of "8" being the "virtual edge" of the pulse. Therefore, even though the pulse width is narrowed due to distortion or underequalization, the averaging operation described hereinabove will accommodate for that and actually adjust the edge to its correct value.

In summary, there has been provided a digital phase lock loop for use with a line receiver in a 100 BASE-T application. The phase lock loop is generally comprised of a phase encoder for generating a reference phase between a master clock and the received data. A phase error is generated between an output phase from the phase lock loop and the input phase of the received data relative to the master clock, which phase error is then filtered with a loop filter. The output phase corresponds to one of multiple delayed clocks from the internal master clock, which delayed clock then comprises the receive clock or phase adjusted clock. The phase error is generated by averaging the phase error of a predetermined number of input transitions of the master clock and then only generating the phase error once every predetermined number of symbol periods, this being a decimation operation. The averaging is facilitated by averaging the number of transitions received and dividing this by the number of potential transitions that could be received. Once the phase error is determined, the delayed master clock is then selected by clocking the new selection on the edge of the recovered clock as opposed to the master clock such that it is synchronous with the recovered clock. This utilizes a gray encoding scheme such that for any change in the phase error, only a single bit will change in the value for the phase error.

Although the preferred embodiment has been described in detail, it should be understood that various changes, substitutions and alterations can be made therein without departing from the spirit and scope of the invention as defined by the appended claims.

What is claimed is:

1. A timing recovery system for recovering timing information from a received data signal having multi-level data therein, comprising:

a phase encoder for determining the phase of the received data signal relative to a master clock signal;

a phase error device for determining the error between an output phase value and the received phase of the received data signal to generate a phase error for each transition in the received data signal, said phase error device having:
- an averaging device for averaging the determined phase error value for each received transition in a decimation window of a predetermined potential transition length, and
- a decimator for outputting the averaged phase error value from said averaging device at the end of each decimation window as said output phase value; and
- a receive clock generator for generating a clock having a phase value relative to the master clock equal to the phase error output by said decimator.

2. The timing recovery system of claim 1 wherein said decimator is operable to store said averaged phase value after determination thereof at the end of said decimation window and, if no transitions are present in said decimation window, said decimator is operable to output the previously stored value from a previous decimation window.

3. The timing recovery system of claim 1 wherein the received data signal has transitions only when a level has changed in the multi-level data therein during a symbol period of the multi-level data comprised of symbols and wherein a potential transition occurs during each symbol period and said decimation window is comprised of a plurality of said symbol periods equal to said predetermined transition length.

4. The timing recovery system for claim 1 wherein said receive clock generator generates a plurality of incremented phase clocks, each differing incrementally only in phase from said master clock signal and each having a phase value associated therewith, and compares the phase of each of said plurality of incremented phase clocks to the phase of said received data signal and selecting as the phase of the receive clock generator the phase value of one of the plurality of the incremented phase clocks closest in relative phase thereto with respect to said master clock signal.

5. The timing recovery system for claim 4 wherein said receive lock generator is operable to generate a receive clock corresponding to the one of said plurality of incremented phase clocks corresponding to the output phase value.

6. The timing recovery system of claim 1 wherein said decimator further includes a loop filter for filtering the response thereof, said loop filter operating at a clock rate equal to the master clock rate divided by the decimation ratio of said decimator defined as the ratio of the number of potential transitions of the received data signal in said decimator window to one.

7. A method for recovering timing information from a received data signal having multi-level data therein, comprising the steps of:
- determining the phase of the received data signal relative to a master clock signal;
- determining the error between an output phase value and the received phase of the received data signal to generate a phase error for each transition in the received data signal, the step of determine the error including the steps of:
  - averaging the determined phase error value for each received transition in a decimation window of a predetermined potential transition length, and
  - outputting the averaged phase error value from the step of averaging at the end of each decimation window as the output phase value; and
- generating in a receive clock generator a clock having a phase value relative to the master clock equal to the phase error output by the step of outputting.

8. The method of claim 7 wherein the step of outputting is operable to store the averaged phase value after determination thereof at the end of the decimation window and, if no transitions are present in the decimation window, the step of outputting is operable to output the previously stored value from a previous decimation window.

9. The method of claim 7 wherein the received data signal has transitions only when a level has changed in the multi-level data therein during a symbol period of the multi-level data comprised of symbols and wherein a potential transition occurs during each symbol period and the decimation window is comprised of a plurality of the symbol periods equal to the predetermined transition length.

10. The method of claim 7 wherein the step of determining the phase comprises the steps of:
- generating in a phase clock generator a plurality of incremented phase clocks, each differing incrementally only in phase from the master clock signal and each having a phase value associated therewith; and
- comparing with a comparator the phase of each of the plurality of incremented phase clocks to the phase of the received data signal and selecting as the phase of the receive clock generator the phase value of one of the plurality of the incremented phase clocks closest in relative phase thereto with respect to the master clock signal.

11. The method of claim 10 wherein the receive clock generator is operable to generate a receive clock corresponding to the one of the plurality of incremented phase clocks corresponding to the output phase value.

12. The method of claim 7 wherein the step of outputting further includes the step of filtering the response thereof, the step of filtering operating at a clock rate equal to the master clock rate divided by the decimation ratio of the step of outputting defined as the ratio of the number of potential transitions of the received data signal in the decimator window to one.

13. A timing recovery system for receiving timing information from a received signal having digital data contained therein, comprising:
- a receive clock generator for generating a receive clock having a variable phase;
- a phase detector for determining the phase of the received signal relative to that of a master clock and determining the relative phase therebetween;
- a phase lock loop for determining a multi-bit digital output phase value necessary to phase lock said receive clock to the received data, said output phase value having an incremental value;
- a phase control device for varying the phase of said receive clock generator to said output phase value, this operation synchronized with said receive clock; and
- a synchronizing circuit for synchronizing said output phase value that is synchronized to said master clock to a phase value synchronized to said receive clock, wherein any error in generating a phase change in said receive clock will be synchronized to said receive clock and is restricted to a single value in the incremented values of said output phase value.

14. The timing recovery system of claim 13, wherein said receive clock is operable to be incremented in phase and wherein said receive clock is generated from said master clock such that a plurality of incremental receive clock signals are generated, each having a delayed phase from said master clock and each associated with one of said incremental phase output values.

15. The timing recovery system of claim 13, wherein said digital output phase value from said phase lock loop is a BCD value and wherein said synchronizing circuit comprises:
- a Gray encoding device for encoding said BCD value such that, for each incremental change, only one bit changes in said Gray encoded value;
- a first latch for latching said Gray encoded signal on a first output in synchronization with said master clock; and
- a second latch for latching the output of said first latch to a second output in synchronization with said receive clock, said second output comprising the phase value for controlling said receive clock generator.

16. A method for receiving timing information from a received signal having digital data contained therein, comprising the steps of:
- generating a receive clock with a receive clock generator having a variable phase;
- determining the phase of the received signal relative to that of a master clock and determining the relative phase therebetween;
- processing the received signal through a phase lock loop and determining a multi-bit digital output phase value necessary to phase lock the receive clock to the received data, the output phase value having an incremental value;
- varying the phase of the receive clock generator to the output phase value, this operation synchronized with the receive clock; and
- synchronizing the output phase value that is synchronized to the master clock to a phase value synchronized to the receive clock, wherein any error in generating a phase change in the receive clock will be synchronized to the receive clock and is restricted to a single value in the incremented values of the output phase value.

17. The method of claim 16, wherein the receive clock is operable to be incremented in phase and wherein the receive clock is generated from the master clock such that a plurality of incremental receive clock signals are generated, each having a delayed phase from the master clock and each associated with one of the incremental phase output values.

18. The method of claim 16, wherein the digital output phase value from the phase lock loop is a BCD value and wherein the step of synchronizing includes the steps of:
- encoding the BCD value with a Gray encoding algorithm such that, for each incremental change, only one bit changes in the Gray encoded value;
- for latching in a first latch the Gray encoded signal on a first output in synchronization with the master clock; and
- for latching in a second latch the output of the first latch to a second output in synchronization with the receive clock, the second output comprising the phase value for controlling the step of generating the receive clock.

* * * * *